United States Patent
Takahara et al.

(10) Patent No.: US 11,651,938 B2
(45) Date of Patent: May 16, 2023

(54) IMPEDANCE MATCHING DEVICE PROVIDED IN HIGH-FREQUENCY POWER SYSTEM

(71) Applicant: Adtec Plasma Technology Co., Ltd., Hiroshima (JP)

(72) Inventors: Toshihiro Takahara, Hiroshima (JP); Etsuro Kawata, Hiroshima (JP); Takamichi Kishira, Hiroshima (JP); Takehiro Okazaki, Hiroshima (JP); Nobutaka Fujiwara, Hiroshima (JP); Atsushi Katsuya, Hiroshima (JP); Kenta Nakamura, Hiroshima (JP)

(73) Assignee: ADTEC PLASMA TECHNOLOGY CO., LTD., Hiroshima (JP)

( * ) Notice: Subject to any disclaimer, the term of this patent is extended or adjusted under 35 U.S.C. 154(b) by 315 days.

(21) Appl. No.: 16/564,234

(22) Filed: Sep. 9, 2019

(65) Prior Publication Data
US 2020/0098546 A1    Mar. 26, 2020

(30) Foreign Application Priority Data

Sep. 21, 2018   (JP) .............................. JP2018-177136

(51) Int. Cl.
*H01J 37/32*    (2006.01)
*H03H 7/38*    (2006.01)

(52) U.S. Cl.
CPC ......... *H01J 37/32183* (2013.01); *H03H 7/38* (2013.01); *H01J 2237/327* (2013.01)

(58) Field of Classification Search
None
See application file for complete search history.

(56) References Cited

U.S. PATENT DOCUMENTS

2008/0158927 A1* 7/2008 Omae ............... H01J 37/32091
                                                           363/165
2014/0145636 A1* 5/2014 Merte ............... H01J 37/32174
                                                           315/224

(Continued)

FOREIGN PATENT DOCUMENTS

CN        105247967 A    1/2016
JP        2006-310245    11/2006

(Continued)

*Primary Examiner* — Ram N Kackar
(74) *Attorney, Agent, or Firm* — Kirschstein, Israel, Schiffmiller & Pieroni, P.C.

(57) ABSTRACT

Provided is an impedance matching device capable of promptly improving an impedance mismatch between a high-frequency power source and a load even when the impedance of the load continuously changes.

An impedance matching device according to the present invention is for use in a high-frequency power system configured to supply a load with an output from a high-frequency power source via a matching circuit whose constant is mechanically changed, and the impedance matching device includes a matching condition value acquisition portion for acquiring a matching condition value indicating a matching condition between the high-frequency power source and a load, and a control portion for controlling an oscillation frequency of the high-frequency power source based on the matching condition value. When the matching condition value indicates deterioration of the matching condition, the control portion changes the oscillation frequency with a first slope toward improving the matching condition, and thereafter shifts the oscillation frequency back to an original value with a second slope more gradual than the first slope.

5 Claims, 6 Drawing Sheets

(56) References Cited

U.S. PATENT DOCUMENTS

| | | | | |
|---|---|---|---|---|
| 2014/0367043 A1* | 12/2014 | Bishara | ............ | H01J 37/32082 |
| | | | | 156/345.28 |
| 2016/0204757 A1* | 7/2016 | Kim | ........................ | H03H 7/40 |
| | | | | 333/32 |
| 2016/0259872 A1* | 9/2016 | Howald | .................. | G06F 17/11 |

FOREIGN PATENT DOCUMENTS

| | | |
|---|---|---|
| JP | 2016-528667 | 9/2016 |
| TW | 1562189 | 12/2016 |
| WO | 2013132591 | 9/2013 |
| WO | 2014204627 | 12/2014 |

\* cited by examiner

IMPEDANCE MATCHING DEVICE PROVIDED IN HIGH-FREQUENCY POWER SYSTEM

TECHNICAL FIELD

The present invention relates to an impedance matching device for use in a high-frequency power system configured to supply a load with an output from a high-frequency power source via a matching circuit whose constant is mechanically changed.

BACKGROUND ART

Semiconductor manufacturing processes, such as etching and thin-film formation, use a plasma treatment device and a high-frequency power system for supplying the plasma treatment device with necessary power. The high-frequency power system normally has the function of achieving an impedance match with the plasma treatment device in order to stably and efficiently supply the plasma treatment device with power.

Figure 11:
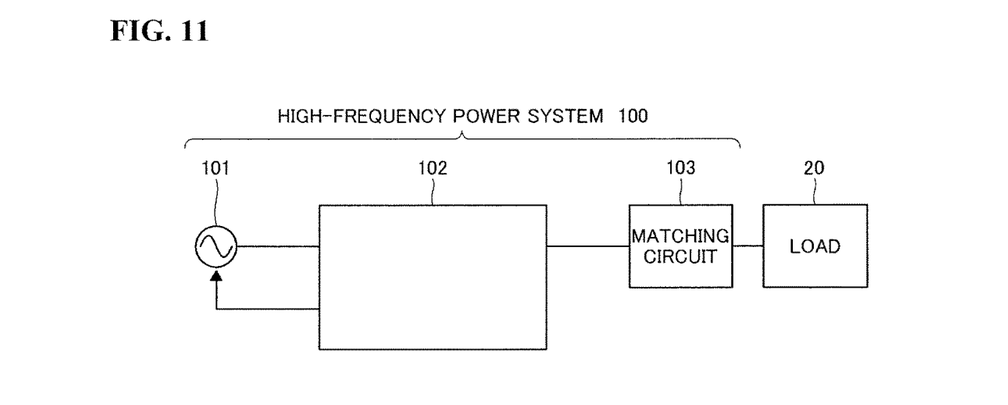
FIG. 11 is a block diagram illustrating a schematic configuration of a conventional high-frequency power system.

Patent Document 1 discloses a high-frequency power system 100 with an impedance matching function, including a high-frequency power source 101, an impedance matching device 102, and a matching circuit 103 (see FIG. 11). The impedance matching device 102 is configured to change an oscillation frequency of the high-frequency power source 101 in accordance with an impedance matching condition between the high-frequency power source 101 and a load 20 (a plasma treatment device). Moreover, the matching circuit 103 consists of passive elements whose constants are mechanically changed.

The high-frequency power system 100 is claimed to allow a broader matching range than do conventional systems by combining impedance matching which offers a fast matching speed but a narrow matching range, as achieved by changing the oscillation frequency, and impedance matching which offers a wide matching range but a slow matching speed, as achieved by the matching circuit 103.

PRIOR ART DOCUMENT

Patent Document

Patent Document 1: International Publication No. WO 2013/132591

DISCLOSURE OF THE INVENTION

Problems To Be Solved by the Invention

However, the conventional high-frequency power system 100 might not be able to improve an impedance mismatch caused by the impedance of the load 20 continuously changing after plasma ignition, resulting in unstable plasma or misfire.

The present invention has been achieved in view of the above issue, with a problem to be solved being to provide an impedance matching device capable of promptly improving an impedance mismatch between a high-frequency power source and a load even when the impedance of the load continuously changes.

Solution to the Problems

To solve the above problem, the present invention provides an impedance matching device for use in a high-frequency power system configured to supply a load with an output from a high-frequency power source via a matching circuit whose constant is mechanically changed, the device including a matching condition value acquisition portion for acquiring a matching condition value indicating a matching condition between the high-frequency power source and the load, and a control portion for controlling an oscillation frequency of the high-frequency power source based on the matching condition value, wherein, when the matching condition value indicates deterioration of the matching condition, the control portion changes the oscillation frequency with a first slope toward improving the matching condition, and thereafter shifts the oscillation frequency back to an original value with a second slope more gradual than the first slope.

The control portion of the impedance matching device may change the oscillation frequency with the first slope for a predetermined mismatch reduction period. In this case, when the mismatch reduction period ends, the control portion may start shifting the oscillation frequency back to the original value with the second slope, regardless of the matching condition indicated by the matching condition value.

Alternatively, the control portion of the impedance matching device may change the oscillation frequency with the first slope until the matching condition value indicates that the matching condition has been improved to a predetermined degree.

Furthermore, when an amount of change in the matching condition value exceeds a predetermined threshold, the control portion of the impedance matching device may start changing the oscillation frequency with the first slope.

Furthermore, the matching condition value used in the impedance matching device can be a value related to a reflected wave amplitude.

An example of the load on the impedance matching device is a plasma treatment device.

Effect of the Invention

The present invention renders it possible to provide an impedance matching device capable of promptly improving an impedance mismatch between a high-frequency power source and a load even when the impedance of the load continuously changes.

MODE FOR CARRYING OUT THE INVENTION

Hereinafter, embodiments of an impedance matching device according to the present invention will be described with reference to the accompanying drawings.

First Embodiment

Figure 1:
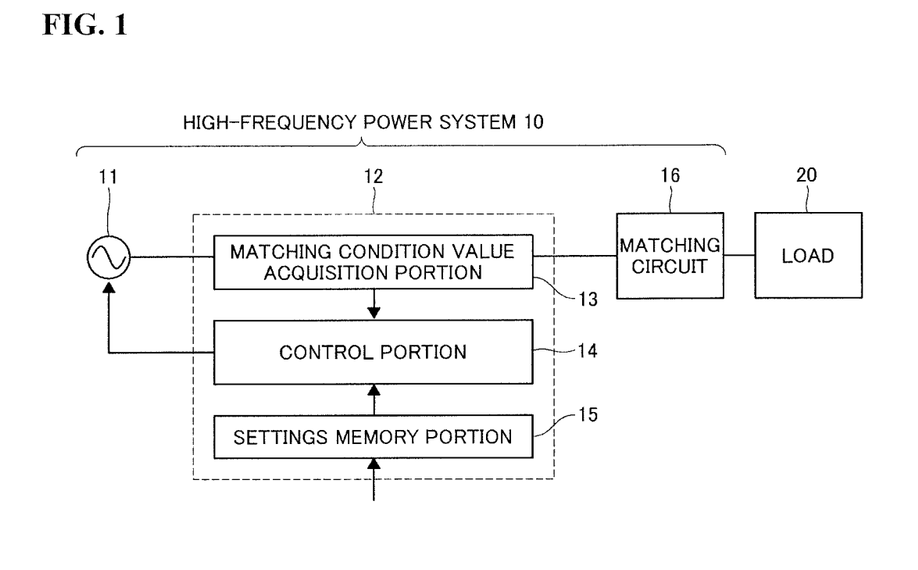
FIG. 1 is a block diagram illustrating a schematic configuration of a high-frequency power system including an impedance matching device according to the present invention.
Figure 2A:
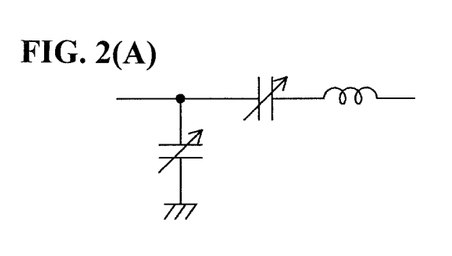
FIGS. 2(A), 2(B), 2(C) and 2(D) provide circuit diagrams illustrating specific matching circuit configurations.
Figure 2B:
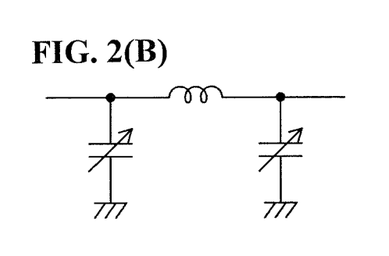
Figure 2C:
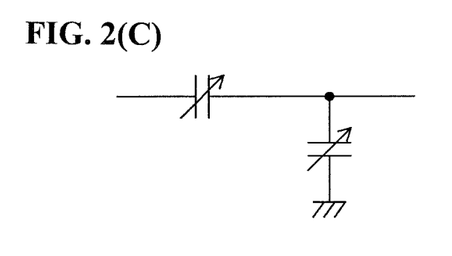
Figure 2D:
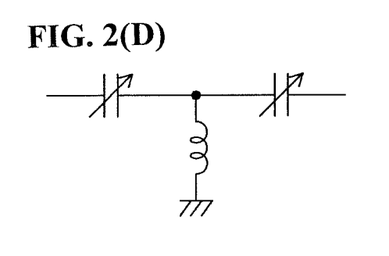

FIG. 1 illustrates a high-frequency power system 10 including an impedance matching device 12 according to a first embodiment of the present invention. The high-frequency power system 10 is intended for supplying a load 20 with necessary power, and further includes a high-frequency power source 11 and a matching circuit 16, as shown in the figure.

The high-frequency power source 11 outputs high-frequency power to the load 20 via the matching circuit 16. The high-frequency power source 11 is configured such that an oscillation frequency (i.e., a frequency of the high-frequency power) can be adjusted within a certain range (in the present embodiment, the range of ±1.00 MHz from 13.56 MHz at the center) in accordance with a command from the impedance matching device 12.

The matching circuit 16 includes two capacitors, each of which has a variable constant (capacitance), and one inductor, as shown in (A) of FIG. 2. The constants of the capacitors are changed by a matching condition sensing portion and a control portion included in the matching circuit 16, both of which are unillustrated, so as to improve an impedance mismatch between the high-frequency power source 11 and the load 20. However, such a change is mechanically performed using an electric actuator or suchlike, and therefore is very gradual.

It should be noted that the circuit configuration of the matching circuit 16 is not limited to that shown in (A) of FIG. 2, and may be, for example, as shown in (B) to (D) of the figure. In the present invention, the circuit configuration of the matching circuit 16 can be suitably selected in accordance with the configuration of the load 20 and/or other factors.

As is apparent from FIG. 1, the matching circuit 16 is independent from the impedance matching device 12. Accordingly, it can be said that, when viewed from the impedance matching device 12, the constants of the matching circuit 16 are changed autonomously.

The load 20 is a plasma treatment device (more specifically, a coil wound on a plasma chamber included in the plasma treatment device) for use in semiconductor manufacturing processes such as etching and thin-film formation. The impedance of the load 20 changes with each moment in accordance with, for example, the type and the amount of gas being introduced into the plasma chamber.

The impedance matching device 12 includes a matching condition value acquisition portion 13, a control portion 14, and a settings memory portion 15. The impedance matching device 12 may be accommodated as a whole or in part (e.g., the control portion 14 and the settings memory portion 15) in a housing of the high-frequency power source 11 or the matching circuit 16. Alternatively, all of the high-frequency power source 11, the impedance matching device 12, and the matching circuit 16 may be accommodated in one housing.

The matching condition value acquisition portion 13 is a directional coupler disposed on a power line connecting the high-frequency power source 11 and the matching circuit 16. The matching condition value acquisition portion 13 outputs a value related to a reflected wave amplitude (reflected power value) as a matching condition value indicating a matching condition between the high-frequency power source 11 and the load 20. The settings memory portion 15 is volatile or non-volatile memory. The settings memory portion 15 has memorized therein settings information inputted by a user in relation to the operation of the control portion 14. The control portion 14 is a computer unit such as an MPU (micro-processing unit). The control portion 14 outputs a control signal for controlling the oscillation frequency of the high-frequency power source 11, on the basis of the matching condition value outputted by the matching condition value acquisition portion 13 and the settings information memorized in the settings memory portion 15.

Figure 3:
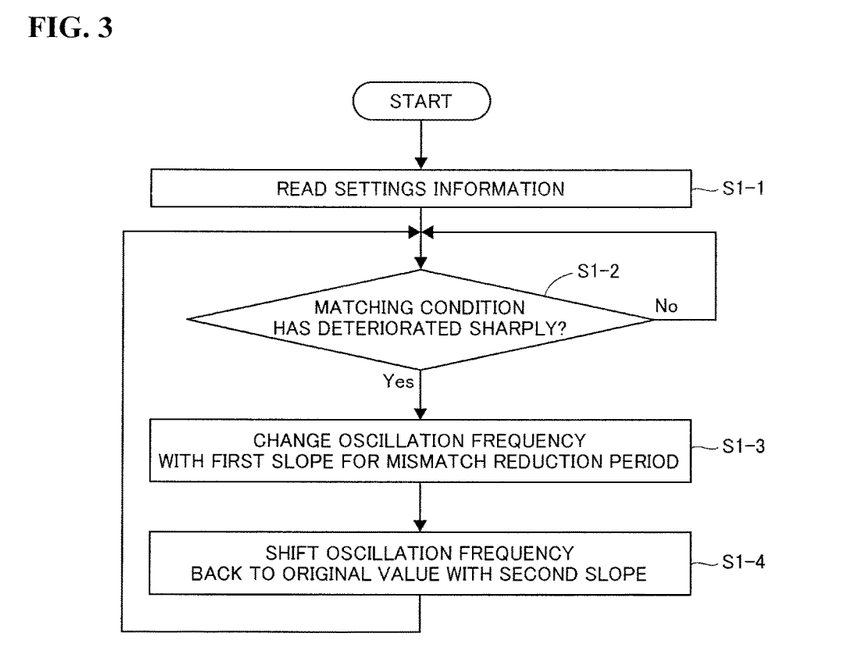
FIG. 3 is a flowchart showing an operation of a control portion included in an impedance matching device according to a first embodiment of the present invention.
Figures 4A, 4B:
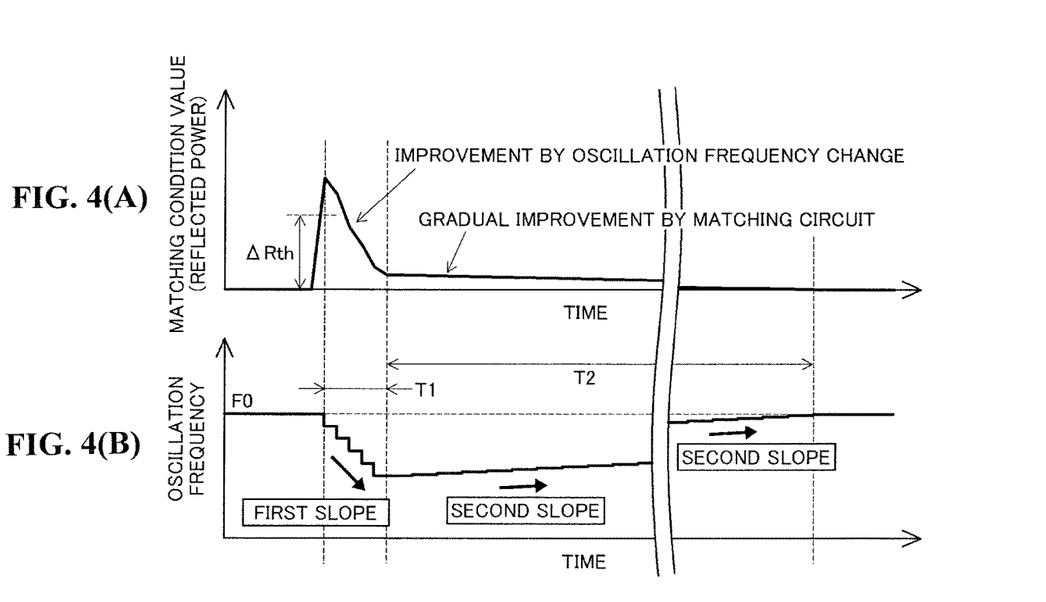
FIGS. 4(A) and 4(B) provide graphs describing an operation of the high-frequency power system according to the first embodiment.
Figure 5A:
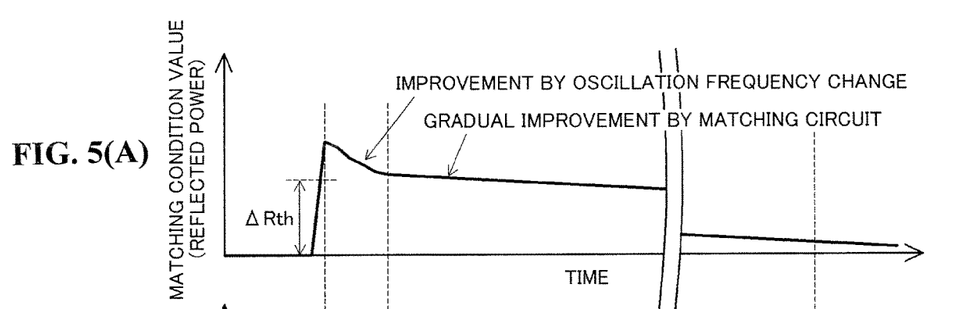
FIGS. 5(A) and 5(B) provide graphs describing another operation of the high-frequency power system according to the first embodiment.
Figure 5B:
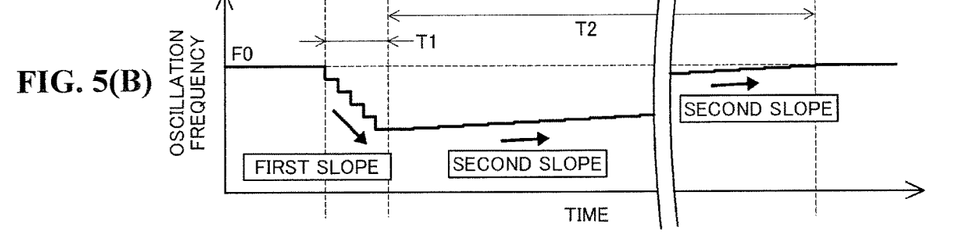

Next, an operation example of the control portion 14 in the first embodiment will be described with reference to FIGS. 3 to 5. Note that for the sake of simplification, the following will be described with respect to the case where the impedance of the load 20 changes under the conditions that plasma ignition has already been completed, the oscillation frequency of the high-frequency power source 11 is a center frequency F0 (=13.56 MHz), and there is no reflected wave.

Initially, the control portion 14 reads the settings information memorized in the settings memory portion 15 (step S1-1). The settings information is related to a first slope, a second slope, a mismatch reduction period, and a threshold.

Next, the control portion 14 determines whether the matching condition has deteriorated sharply, on the basis of the matching condition value (step S1-2). More specifically, the control portion 14 refers to the matching condition value every 100 μs, and when the amount of change between the previous matching condition value and the latest matching condition value exceeds a threshold ΔRth, the control portion 14 determines that the matching condition has deteriorated sharply. The control portion 14 repeats step S1-2 every 100 μs until the matching condition deteriorates sharply.

Once the matching condition deteriorates sharply, the control portion 14 changes the oscillation frequency with the first slope toward improving the matching condition for the mismatch reduction period T1 (step S1-3). More specifically, the control portion 14 changes (in the operation example shown in FIGS. 4 and 5, decreases) the oscillation frequency every 100 μs by an amount corresponding to the first slope.

In the present embodiment, the mismatch reduction period T1 is set at 500 μs. Accordingly, the control portion 14 changes the oscillation frequency five times during the mismatch reduction period T1. Moreover, in the present embodiment, the first slope is set at 5 Hz/μs. Accordingly, the control portion 14 decreases (or increases) the oscillation frequency every 100 μs by 500 Hz.

After a lapse of the mismatch reduction period T1, the control portion 14 shifts the oscillation frequency back to the center frequency F0 with the second slope (step S1-4). More specifically, the control portion 14 changes (in the operation example shown in FIGS. 4 and 5, increases) the oscillation frequency toward the center frequency F0 every 100 μs by an amount corresponding to the second slope.

In the present embodiment, the second slope is set at 2.5 Hz/ms. That is, in the present embodiment, the second slope is set at 1/2000 of the first slope. Accordingly, the control portion 14 decreases (or increases) the oscillation frequency every 100 μs by 0.25 Hz.

It should be noted that not only in the case where the mismatch is significantly improved during the mismatch reduction period T1 (see FIG. 4), but also in the case where the mismatch is not significantly improved during the mismatch reduction period T1 (see FIG. 5), the control portion 14 executes step S1-4 after a lapse of the mismatch reduction period T1, without further changing the oscillation frequency with the first slope.

The mismatch that was not improved at step S1-3 is slowly improved by the constants of the matching circuit 16 being changed autonomously. Specifically, during a period T2 in which the oscillation frequency of the high-frequency power source 11 returns to the center frequency F0 with the second slope, the constants and the oscillation frequency are changed in parallel, but since the second slope is very gradual, as described earlier, both changes do not compete with each other, with the result that no hunting oscillation occurs.

Figure 6A:
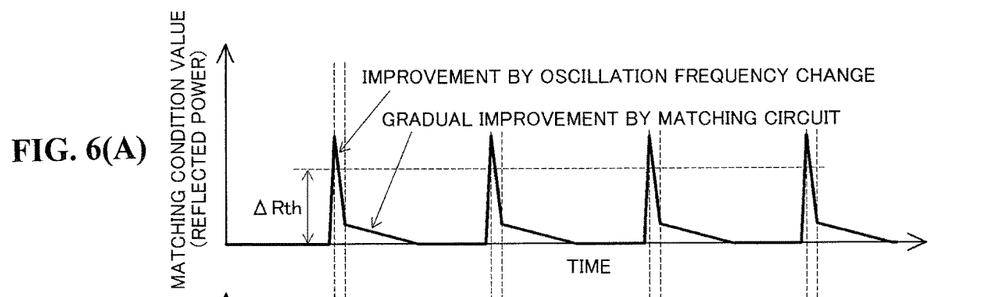
FIGS. 6(A) and 6(B) provide graphs describing still another operation of the high-frequency power system according to the first embodiment.
Figure 6B:
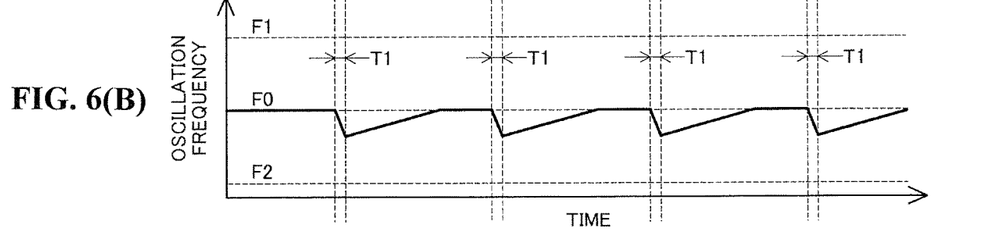
Figure 7A:
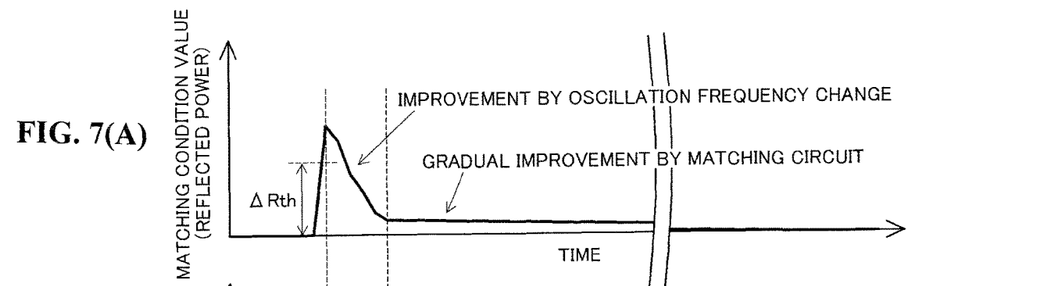
FIGS. 7(A) and 7(B) provide graphs describing an operation of a high-frequency power system according to a comparative example.
Figure 7B:
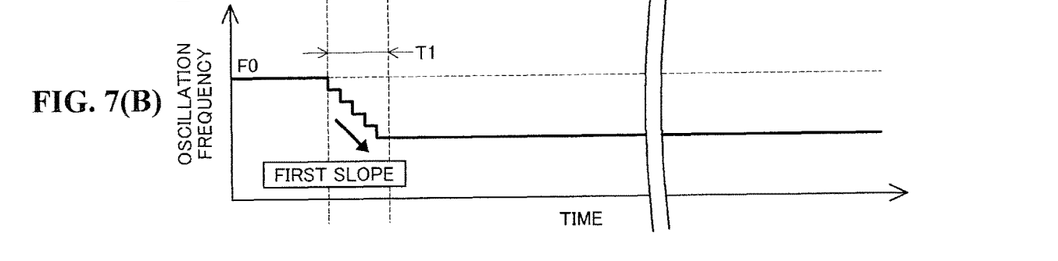
Figure 8A:
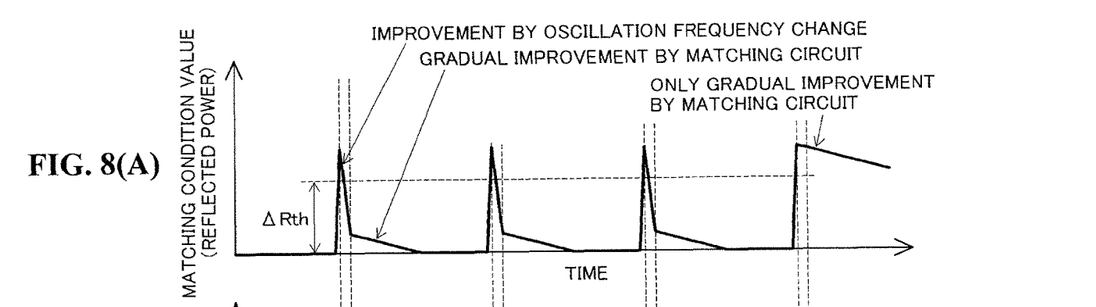
FIGS. 8(A) and 8(B) provide graphs describing another operation of the high-frequency power system according to the comparative example.
Figure 8B:
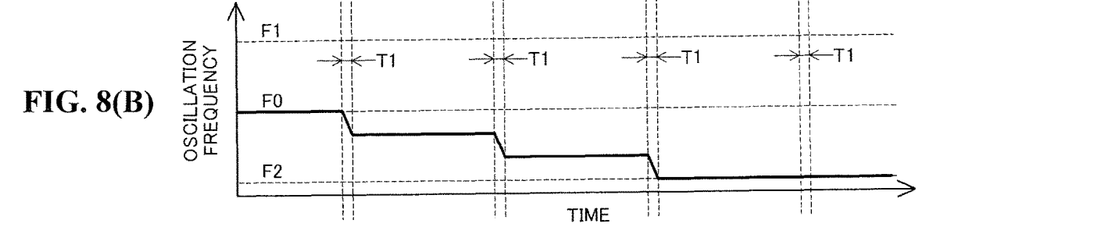

In this manner, the impedance matching device 12 according to the present embodiment changes the oscillation frequency of the high-frequency power source 11 and thereby improves the mismatch to some degree, and thereafter shifts the oscillation frequency back to the original value. Accordingly, even when the matching condition continuously deteriorates, the impedance matching device 12 according to the present embodiment changes the oscillation frequency within the range between an upper frequency F1 (in the present embodiment, 14.56 MHz) and a lower frequency F2 (in the present embodiment, 12.56 MHz), thereby improving the matching condition within a short period of time (see FIG. 6).

On the other hand, in a comparative example where step S1-4 is not performed after step S1-3 (see FIGS. 7 and 8), when the matching condition continuously deteriorates, the oscillation frequency reaches either the upper frequency F1 or the lower frequency F2 (in FIG. 8, the lower frequency F2), and thereafter, the matching condition cannot be improved by changing the oscillation frequency. That is, in the comparative example, when the matching condition continuously deteriorates, the matching condition cannot be improved within a short period of time. Note that the high-frequency power system 100 described in Patent Document 1 has a commonality with the comparative example in that no operation corresponding to step S1-4 is performed.

Second Embodiment

Figure 9:
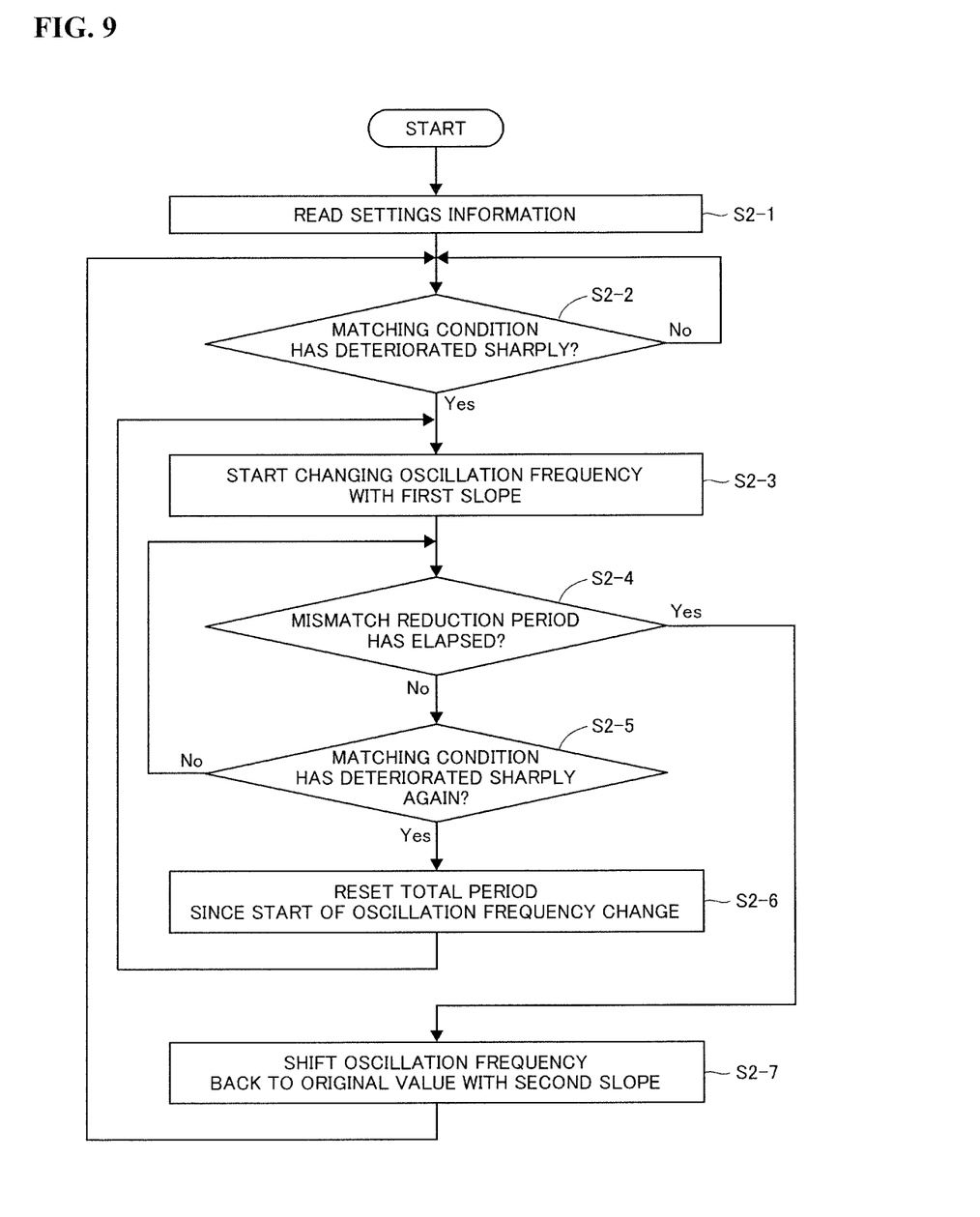
FIG. 9 is a flowchart showing an operation of a control portion included in an impedance matching device according to a second embodiment of the present invention.
Figure 10A:
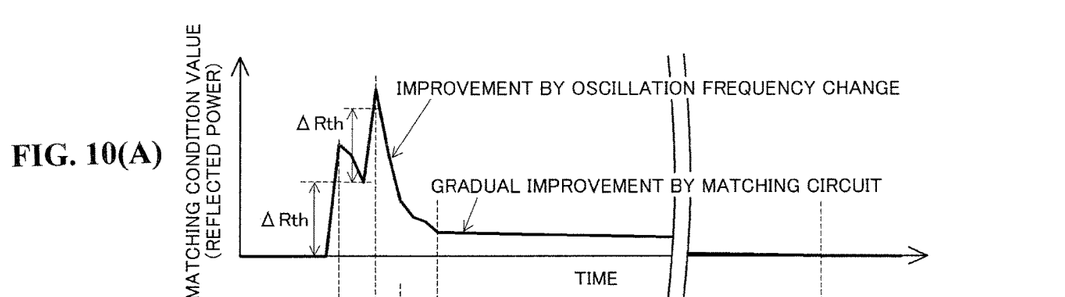
FIGS. 10(A) and 10(B) provide graphs describing an operation of the high-frequency power system according to the second embodiment.
Figure 10B:
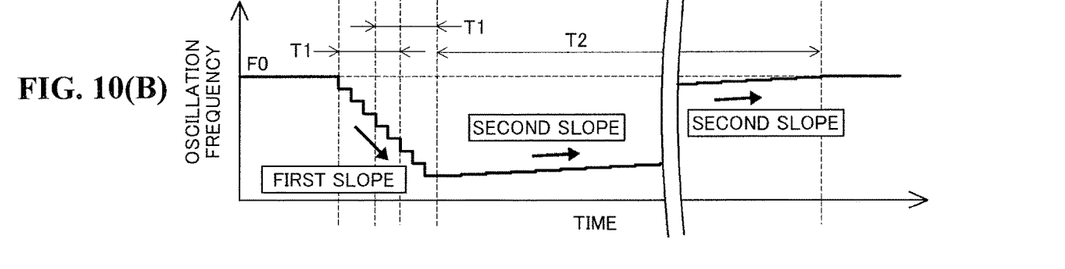

An impedance matching device 12 according to a second embodiment of the present invention includes a matching condition value acquisition portion 13, a control portion 14, and a settings memory portion 15, as in the first embodiment. However, in the present embodiment, the control portion 14 is operated differently from the first embodiment. An operation example of the control portion 14 in the second embodiment will be described below with reference to FIGS. 9 and 10.

Initially, the control portion 14 reads settings information memorized in the settings memory portion 15 (step S2-1). The settings information is related to a first slope, a second slope, a mismatch reduction period, and a threshold.

Next, the control portion 14 determines whether the matching condition has deteriorated sharply (step S2-2), as in step S1-2 of the first embodiment. The control portion 14 repeats step S2-2 every 100 μs until the matching condition deteriorates sharply.

Once the matching condition deteriorates sharply, the control portion 14 starts changing the oscillation frequency with the first slope toward improving the matching condition (step S2-3). More specifically, the control portion 14 starts changing (in the operation example shown in FIG. 10, decreasing) the oscillation frequency every 100 μs by an amount corresponding to the first slope. The first slope is set at 5 Hz/μs, as in the first embodiment.

Next, the control portion 14 determines whether a total period since the start of the oscillation frequency change has reached a mismatch reduction period T1 in order words, whether the mismatch reduction period T1 has elapsed (step S2-4).

In the case where the mismatch reduction period T1 is determined to have elapsed, the control portion 14 shifts the oscillation frequency back to the center frequency F0 with the second slope (step S2-7), as in step S1-4 of the first embodiment. The second slope is set at 2.5 Hz/ms, as in the first embodiment. That is, in the present embodiment also, the second slope is 1/2000 of the first slope.

On the other hand, when the mismatch reduction period T1 is not determined to have elapsed, the control portion 14 determines whether the matching condition has deteriorated sharply again (step S2-5), as in step S2-2.

When the matching condition is determined to have deteriorated sharply again, the control portion 14 resets the total period since the start of the oscillation frequency change (step S2-6), and starts changing the oscillation frequency with the first slope toward improving the matching condition (step S2-3).

The control portion 14 repeats steps S2-4 and S2-5 until the mismatch reduction period T1 elapses or the matching condition deteriorates sharply during the mismatch reduction period T1.

In this manner, once the matching condition deteriorates sharply again during the mismatch reduction period T1, the impedance matching device 12 according to the present embodiment keeps on changing the oscillation frequency with the first slope from the start of the deterioration onward during the mismatch reduction period T1. Accordingly, even when the matching condition continually deteriorates at very short intervals, the impedance matching device 12 according to the present embodiment can improve the matching condition within a short period of time.

Variant

It should be noted that the impedance matching device according to the present invention has variants as exemplified below.

The control portion 14 may use VSWR (voltage standing wave ratio), which is obtained based on reflected wave power and travelling wave power, as a matching condition value to be referred to when determining whether the matching condition has deteriorated sharply.

The settings memory portion 15 may memorize combinations of an interval for changing the oscillation frequency and an amount of single change as the "first slope" and the "second slope". In such a case, as the "mismatch reduction period", the settings memory portion 15 may memorize the number of times the oscillation frequency is to be changed with the first slope.

The settings memory portion 15 may memorize as the "first slope" a combination of an interval for changing the oscillation frequency and a rule for deciding an amount of single change based on the matching condition value (the reflected wave amplitude or the VSWR). In such a case, the control portion 14 changes the oscillation frequency by an amount corresponding to the latest matching condition value. Moreover, in this case, the "first slope" might be changed during the mismatch reduction period. With this configuration, even when there is a large mismatch, the mismatch can be promptly improved by sharply changing the oscillation frequency.

The settings memory portion 15 may memorize a "target matching condition" instead of the "mismatch reduction period". In such a case, the control portion 14 changes the oscillation frequency with the first slope until the matching condition value indicates that the matching condition has been improved to the "target matching condition", and thereafter, the control portion 14 shifts the oscillation frequency with the second slope.

The load 20 does not have to be a plasma treatment device.

Specific numerical values in the first and second embodiments are merely illustrative examples and may be suitably changed. Note that from the viewpoint of preventing hunting oscillation, it is preferable to set the second slope as low as possible. However, when the second slope is excessively low, another matching condition deterioration occurs during the period T2 (i.e., before the oscillation frequency completely returns to the center frequency F0), causing difficulty in improving the matching condition by changing the oscillation frequency within the range between the upper frequency F1 and the lower frequency F2. Accordingly, when setting the second slope, it is necessary to consider these contradictory circumstances.

DESCRIPTION OF THE REFERENCE CHARACTERS 10 high-frequency power system
11 high-frequency power source
12 impedance matching device
13 matching condition value acquisition portion
14 control portion
15 settings memory portion
16 matching circuit
20 load

The invention claimed is:

1. An impedance matching device for use in a high-frequency power system configured to supply a load with an output from a high-frequency power source via a matching circuit whose constant is mechanically changed, the device comprising:
   a directional coupler for acquiring a matching condition value indicating a matching condition between the high-frequency power source and the load;
   a memory setting unit for storing a first slope, a second slope, a predetermined mismatch reduction period and a predetermined threshold; and
   a computer unit for controlling an oscillation frequency of the high-frequency power source based on the matching condition value, wherein,
   the computer unit is configured to periodically monitor the plasma process and determine matching condition on the basis of the previous matching condition value, the latest matching condition value and the threshold and to change the oscillation frequency with the first slope toward improving the matching condition for the mismatch reduction period when the matching condition deteriorates, and thereafter shift the oscillation frequency back to an original value with the second slope more gradual than the first slope, and
   wherein if the matching condition value indicates more deterioration again during the mismatch reduction period, the computer unit is configured to keep changing the oscillation frequency with the first slope during the mismatch reduction period, which resets to the beginning when the matching condition deterioration is detected.

2. The impedance matching device according to claim 1, wherein, when the mismatch reduction period ends, the computer unit starts shifting the oscillation frequency back to the original value with the second slope, regardless of the matching condition indicated by the matching condition value.

3. The impedance matching device according to claim 1, wherein, when an amount of change in the matching condition value exceeds a predetermined threshold, the computer unit starts changing the oscillation frequency with the first slope.

4. The impedance matching device according to claim 1, wherein the matching condition value is a value related to a reflected wave amplitude.

5. The impedance matching device according to claim 1, wherein the load is a plasma treatment device.

* * * * *